United States Patent
Mui et al.

(10) Patent No.: US 10,044,042 B2
(45) Date of Patent: Aug. 7, 2018

(54) RECHARGEABLE BATTERY WITH WAFER CURRENT COLLECTOR AND ASSEMBLY METHOD

(71) Applicant: Gridtential Energy, Inc., Santa Clara, CA (US)

(72) Inventors: Collin Kwok Leung Mui, Mountain View, CA (US); Daniel Jason Moomaw, Santa Clara, CA (US)

(73) Assignee: Gridtential Energy, Inc., Santa Clara, CA (US)

( * ) Notice: Subject to any disclaimer, the term of this patent is extended or adjusted under 35 U.S.C. 154(b) by 0 days.

(21) Appl. No.: 15/793,277

(22) Filed: Oct. 25, 2017

(65) Prior Publication Data

US 2018/0047992 A1    Feb. 15, 2018

Related U.S. Application Data

(62) Division of application No. 14/286,523, filed on May 23, 2014, now Pat. No. 9,812,713.
(Continued)

(51) Int. Cl.
*H01M 4/66* (2006.01)
*H01M 4/04* (2006.01)
(Continued)

(52) U.S. Cl.
CPC ........ *H01M 4/661* (2013.01); *H01L 21/4875* (2013.01); *H01M 4/14* (2013.01);
(Continued)

(58) Field of Classification Search
None
See application file for complete search history.

(56) References Cited

U.S. PATENT DOCUMENTS

| 3,016,413 A | 1/1962 | Solomon et al. |
| 3,819,412 A | 6/1974 | Taylor et al. |

(Continued)

FOREIGN PATENT DOCUMENTS

| AU | 2014268373 | 9/2017 |
| CN | 101558512 A | 10/2009 |

(Continued)

OTHER PUBLICATIONS

"U.S. Appl. No. 14/286,523, Corrected Notice of Allowance dated Aug. 10, 2017", 2 pgs.
(Continued)

*Primary Examiner* — Sarah A. Slifka
(74) *Attorney, Agent, or Firm* — Schwegman Lundberg & Woessner, P.A.

(57) ABSTRACT

Apparatus and techniques herein related battery plates. For example, a first battery plate can include a conductive silicon wafer. A first mechanical support can be located on a first side of the conductive silicon wafer. A first active material can be adhered to the first mechanical support and the first side of the conductive silicon wafer, the first active material having a first polarity. In an example, the battery plate can be a bipolar plate, such as having a second mechanical support located on a second side of the conductive silicon wafer opposite the first side, and a second active material adhered to the second mechanical support and the second side of the conductive silicon wafer, the second material having an opposite second polarity.

20 Claims, 9 Drawing Sheets

Related U.S. Application Data (60) Provisional application No. 61/826,831, filed on May 23, 2013.

(51) Int. Cl.

| | | |
|---|---|---|
| *H01M 10/04* | (2006.01) | |
| *H01M 4/68* | (2006.01) | |
| *H01M 4/14* | (2006.01) | |
| *H01L 21/48* | (2006.01) | |
| *H01M 10/18* | (2006.01) | |

(52) U.S. Cl.
CPC ............... *H01M 4/66* (2013.01); *H01M 4/68* (2013.01); *H01M 10/0418* (2013.01); *H01M 10/18* (2013.01)

(56) References Cited

U.S. PATENT DOCUMENTS

| | | | |
|---|---|---|---|
| 6,077,623 | A | 6/2000 | Grosvenor et al. |
| 6,432,577 | B1 | 8/2002 | Shul et al. |
| 9,812,713 | B2 | 11/2017 | Mui et al. |
| 2011/0305927 | A1 | 12/2011 | Lev et al. |
| 2012/0155082 | A1 | 6/2012 | Ramer et al. |
| 2012/0183847 | A1 | 7/2012 | Lev et al. |
| 2013/0130096 | A1 | 5/2013 | Lev et al. |
| 2014/0349172 | A1 | 11/2014 | Mui et al. |

FOREIGN PATENT DOCUMENTS

| | | | |
|---|---|---|---|
| CN | 105594021 | A | 5/2016 |
| IN | 11639DELNP2015 | A | 5/2016 |
| JP | 06048169 | A | 2/1994 |
| JP | 2007335206 | A | 12/2007 |
| JP | 4796585 | B2 | 10/2011 |
| JP | 2012004068 | A | 1/2012 |
| JP | 2014507774 | A | 3/2014 |
| JP | 2016522972 | A | 8/2016 |
| KR | 102009001247 | A | 2/2009 |
| KR | 102016002487 | A | 3/2016 |
| WO | WO-2012155082 | A1 | 11/2012 |
| WO | WO-2014190282 | A1 | 11/2014 |

OTHER PUBLICATIONS

"U.S. Appl. No. 14/286,523, Corrected Notice of Allowance dated Sep. 26, 2017", 2 pgs.
"U.S. Appl. No. 14/286,523, Non Final Office Action dated Nov. 9, 2016", 12 pgs.
"U.S. Appl. No. 14/286,523, Non-Final Office Action dated Nov. 9, 2016", 12 pgs.
"U.S. Appl. No. 14/286,523, Notice of Allowance dated Jul. 26, 2017", 7 pgs.
"U.S. Appl. No. 14/286,523, Response filed Apr. 27, 2017 to Non Final Office Action dated Nov. 9, 2016", 9 pgs.
"U.S. Appl. No. 14/286,523, Response filed Aug. 30, 2016 to Restriction Requirement dated Jun. 30, 2016", 6 pgs.
"U.S. Appl. No. 14/286,523, Restriction Requirement dated Jun. 30, 2016", 9 pgs.
"Australian Application Serial No. 2014268373, First Examiner Report dated Jun. 21, 2016", 3 pgs.
"Australian Application Serial No. 2014268373, Response filed Apr. 27, 2017 to First Examiner Report dated Jun. 21, 2017", 22 pgs.
"Canadian Application Serial No. 2,913,059, Office Action dated Jan. 5, 2017", 4 pgs.
"Canadian Application Serial No. 2,913,059, Office Action dated Sep. 5, 2017", 4 pgs.
"Canadian Application Serial No. 2,913,059, Response filed May 5, 2017 to Office Action dated Jan. 5, 2017", 22 pgs.
"Chinese Application Serial No. 201480040601.3, Office Action dated May 25, 2017", w/English Translation, 15 pgs.
"European Application Serial No. 14733438.7, Communication pursuant to Rules 161(1) and 162 EPC dated Jan. 21, 2016", 2 pgs.
"European Application Serial No. 14733438.7, Response filed Jul. 22, 2016 to Communication pursuant to Rules 161(1) and 162 EPC dated Jan. 21, 2016", 19 pgs.
"International Application Serial No. PCT/US2014/039379, International Preliminary Report on Patentability dated Dec. 3, 2015", 9 pgs.
"International Application Serial No. PCT/US2014/039379, International Search Report dated Aug. 29, 2014", 3 pgs.
"International Application Serial No. PCT/US2014/039379, Written Opinion dated Aug. 29, 2014", 7 pgs.
"Korean Application Serial No. 10-2015-7036444, Office Action dated Aug. 23, 2016", w/ Office Action Summary in English, 10 pgs.
"Korean Application Serial No. 1020157036444, Response filed Feb. 22, 2017 to Office Action dated Aug. 23, 2016", w/ English Claims, 29 pgs.
"Japanese Application Serial No. 2016-515119, Office Action dated May 22, 2018", w/English Translation, 6 pgs.
"Canadian Application Serial No. 2,913,059, Response filed Mar. 2, 2018 to Office Action dated Sep. 5, 2017", w/ Amended Claims, 14 pgs.
"Chinese Application Serial No. 201480040601.3, Office Action dated Mar. 28, 2018", w/ English translation, 13 pgs.
"Chinese Application Serial No. 201480040601.3, Response filed Nov. 17, 2017 to Office Action dated May 25, 2017", w/ Amended English Claims, 11 pgs.
"European Application Serial No. 14733438.7, Communication Pursuant to Article 94(3) EPC dated Mar. 7, 2018", 10 pgs.
"Canadian Application Serial No. 2,913,059, Office Action dated May 29, 2018", 4 pgs.

RECHARGEABLE BATTERY WITH WAFER CURRENT COLLECTOR AND ASSEMBLY METHOD

CLAIM OF PRIORITY

This patent application is a divisional application and claims the benefit of priority of Mui et al., U.S. patent application Ser. No. 14/286,523, titled "RECHARGEABLE BATTERY WITH WAFER CURRENT COLLECTOR AND ASSEMBLY METHOD," filed on May 23, 2014, which claimed benefit of Mui et al., U.S. Provisional Patent Application Ser. No. 61/826,831, titled "RECHARGEABLE BATTERY WITH WAFER CURRENT COLLECTOR AND ASSEMBLY METHOD," filed on May 23, 2013, the benefit of each of which is hereby present claimed, and each of which is hereby incorporated by reference herein in its entirety.

BACKGROUND

The lead acid battery, invented by Gaston Planté 1859, can be regarded as the oldest type of rechargeable battery. Despite having a relatively low energy density as compared to other chemistries, generally-available lead acid batteries are simple in construction and economical. Such generally-available lead acid batteries are used in automotive, traction, and stationary applications such as for ignition or for starting internal combustion engines; for lighting; for applications such as motorized wheelchairs, golf carts or fork lifts; or for other applications such as electrical energy storage when coupled to the electric grid.

A lead acid battery generally includes a lead alloy current collector, positive and negative active materials, an electrolyte, separators, and a mechanical support casing. The positive active material generally contains a high-surface-area lead dioxide, whereas the negative active material generally contains spongy lead. The electrolyte is generally sulfuric acid. In generally-available lead acid batteries, a lead alloy is used for the current collectors because of the compatibility of the lead alloy with lead acid chemistry.

Widespread use of lead acid batteries can be attributed at least in part to their simplicity, both in terms of structure and in relation to associated signal conditioning or charging circuitry. A major advantage of the lead acid battery is its low cost. Lead metal is relatively abundant, and an acid, $H_2SO_4$, is a widely-produced bulk chemical. In addition, the manufacturing process for generally-available lead acid batteries is relatively simple. The cost structure of generally-available lead-acid-battery-based energy storage results in an overall cost of around $150/kWh, which can be attractive compared to other energy storage technologies.

OVERVIEW

Despite numerous desirable characteristics, the lead acid battery has several disadvantages, including low energy density and poor cycling life, especially at high discharge current. Although the low energy density of generally-available lead acid batteries can be attributed to high density of lead current collectors and active materials, a poor cycling life at fast discharge rates can be related to the properties of the active materials. From the material standpoint, the current collector in generally-available lead-acid batteries is made of lead, which is heavy and does not contribute to the energy storage capacity of the battery. From the battery assembly perspective, generally-available lead-acid batteries include cells of monopolar plate assemblies electrically coupled in a parallel configuration. In such a configuration, additional electrical connections and conversion systems are used to regulate the operation of the battery to supply higher voltages, which can further affect the overall energy density of lead acid batteries. Such a parallel connection generally results in a high current, low voltage battery, which can also force use of heavy conductors to minimize internal resistance, since ohmic losses scale with the square of the current.

A battery can include a positive plate, a negative plate, and the electrolyte. To construct lead acid battery electrodes, $PbO_2$ and Pb-based active materials can be pasted and cured on lead grid current collectors to form the positive and negative plates. The positive-negative electrodes can form an electrochemical cell with $H_2SO_4$ electrolyte, with a cell voltage of around 2.1V. To assemble a battery pack, cells can be arranged electrically together, in a parallel configuration, a series configuration, or a combination of parallel and series configurations. Additives, separators, and casings can be used for mechanical support.

Replacing the current collectors of generally-available lead-acid batteries with a lighter material can significantly improve energy density. Generally, the current collector is specified to provide low electrical resistivity, along with resisting or being impervious to $H_2SO_4$ corrosion. Such a current collector is generally specified to provide good adhesion to Pb and $PbO_2$ active materials, along with providing compatibility with lead acid battery electrochemistry. Such a current collector can also be specified to provide good thermal conductivity, low leakage current, such as for integrating in existing lead acid battery manufacturing and recycling infrastructure, including being readily available at a low cost.

A bipolar plate architecture can be used to further simplify the electrical configuration of a lead acid battery. Bipolar batteries have been an area of intense research and development over the previous two decades. The primary advantages of bipolar battery technology are high energy density and high power. These can be provided at least in part by a simplified configuration that shortens the current path thus removing unnecessary material/mass and decreasing resistance. A bipolar battery can include a biplate, or current collector, and an active material. The term bipolar refers generally to a configuration where one surface of the biplate is covered with positive active material and an opposite surface is coated with negative active material.

By contrast with a monopolar configuration, a bipolar battery, requires no external connections tying the cells together. For example, each biplate in a bipolar configuration can be separated by electrolyte, but since the biplate itself has a different polarity of active material on either side current flows directly through the biplate from one surface to the other. Such a current can then flow through the electrolyte to the next biplate. This is referred to as a series connection and can present a much lower resistive path than moving through dozens of parallel connections. A lower path resistance means that more current can be extracted from the battery without a loss in efficiency, as compared to a parallel-connect monopolar configuration.

Examples described herein address the energy density issue of the lead acid batteries by using silicon wafers as the current collector with active materials. Such active materials can be in paste form at least during fabrication. A bipolar lead acid battery plate having substrate material and assembly process innovations is described. Silicon wafer material can be used as the current collector because such material can be low cost, thin, and light, can be doped to achieve low resistivity (e.g., to provide conduction through the wafer), and such wafer materials can be impervious to $H_2SO_4$ corrosion, including compatibility with numerous processes in the semiconductor, solar, and printed circuit board industries.

An ohmic contact layer can be formed at the surface of a silicon wafer, followed by the deposition of an adhesion layer for the active materials. A pattern can be deposited onto each side of the current collector substrate to improve the mechanical stability of the plate, such as in an example including a bipolar plate. In an example, $PbO_2$- and Pb-based active materials can be pasted and cured onto positive and negative supporting structures (e.g., grids or bumps), and the current collector can be sandwiched between such positive and negative grids. The bipolar plate assembly can be formed by fusing the active materials onto the current collector wafer substrate. The active materials can be pasted, cured, and formed on the patterned current collector directly. The bipolar plate can then be built into a battery with the integration of electrolyte, separators, casings, and charging or protection circuitry.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
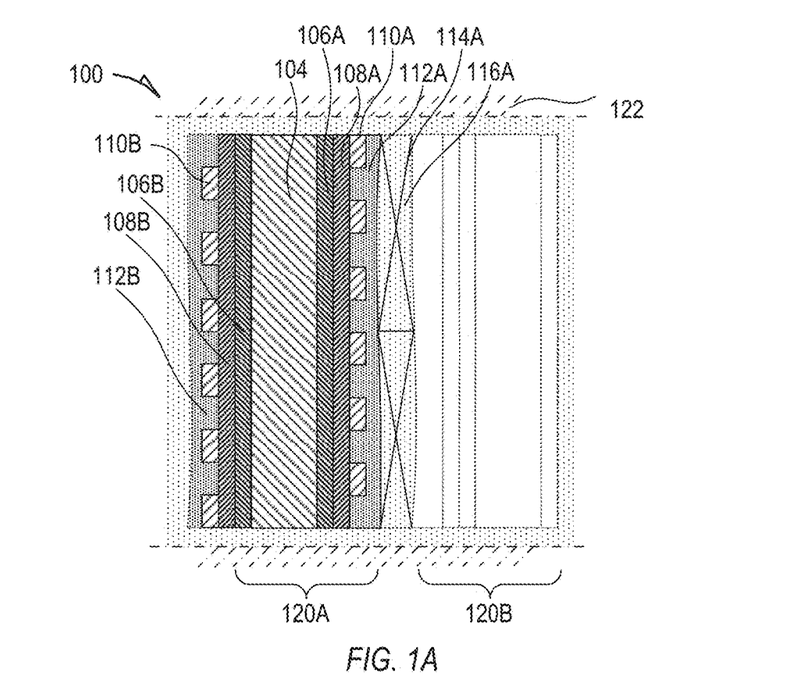
FIGS. 1A and 1B illustrate generally a section view of an example including a monopolar battery plate and a corresponding monopolar battery architecture.
Figure 1B:
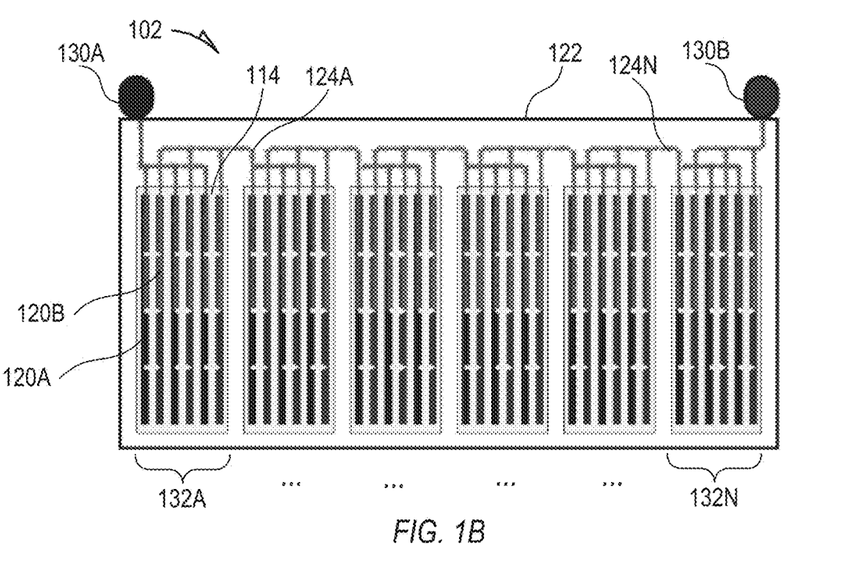

FIGS. 1A and 1B illustrate generally a section view of an example 100 including a monopolar battery plate 120A in FIG. 1A and a corresponding monopolar battery architecture in FIG. 1B. In a monopolar configuration, a current collector generally includes an active material of a single polarity (e.g., positive or negative) applied to both (e.g. opposite) sides of the current collector, such as including application of the active material in paste form. For example, in FIG. 1A, a conductive silicon wafer 104 can provide a substrate for the battery plate 120A assembly, such as to provide the current collector. The conductive silicon wafer 104 can include an ohmic contact layer 106A, such as a metal silicide, to enhance conduction between an active material 112A and the conductive silicon wafer 104. Such a silicide can include a metal species such as nickel, cobalt, titanium, tantalum, tungsten, molybdenum, or combinations thereof. In an example, an adhesion layer 108A can also be included, such as to one or more of promote adhesion or to provide compatibility with an electrolyte in the electrolyte region 116A. Other configurations can be used, such as including multiple film layers to provide one or more of the ohmic contact layer 106A or adhesion layer 108A.

The active material 112A can be provided in paste form, such as cured during fabrication. In order to enhance one or more of adhesion or uniformity of the active material during or after fabrication, a mechanical support 110A can be included. Such a mechanical support 110A can be fabricated using a variety of techniques, such as discussed elsewhere herein, and can include one or more of a lined, grid, bumped, or mesa structure. One or more separators such as a separator 114A can be used to create a cavity or preserve a region 116A for electrolyte. In an example, the electrolyte can be a liquid or gel, or can be included such as impregnating another material, to provide a combination of electrolyte and separator. In the example of FIGS. 1A and 1B, a housing 122 can be provided, and can (but need not) fluidically isolate the electrolyte region 116A from other electrolyte regions between other plates.

In an example of a monopolar plate 120A, the second surface of the battery plate 120A can include a second ohmic contact layer 106B, a second adhesion layer 108A, and a second active material 112B, such as generally including the same materials as the layers on the first surface of the silicon wafer 104. For example, the second active material 112B can include the same active material and polarity as the first active material 112A.

A positive-negative pair can be formed such as including the first plate 120A having a first polarity active material and a second plate 120B having an opposite second polarity active material, to form an electrochemical cell in the electrolyte 114, such as shown illustratively in FIG. 1B. In a lead-acid example, such a single cell voltage can be around 2.1V. A number of cells can be arranged electrically in parallel configuration as a stack 132A. Individual stacks 132A through 132N can be connected in series to assemble a battery pack 102 such that the voltage can be represented as Ns*Vcell, where Ns can represent the number of stacks and Vcell can represent the cell voltage.

In FIG. 1B, a first terminal 130A can provide a first polarity, and a second terminal 130B can provide an opposite second polarity. The first and second terminals can be coupled to the first stack 132A and last stack 132N, respectively, and the stacks can be coupled together serially using a first bus 124A through an "Nth" bus 124N. By contrast to FIG. 1B, a battery architecture using a bipolar plate configuration can offer design simplicity. Respective positive and negative active materials can be applied, such as through pasting, onto opposite sides of the current collector to form a bipolar plate.

Figure 2A:
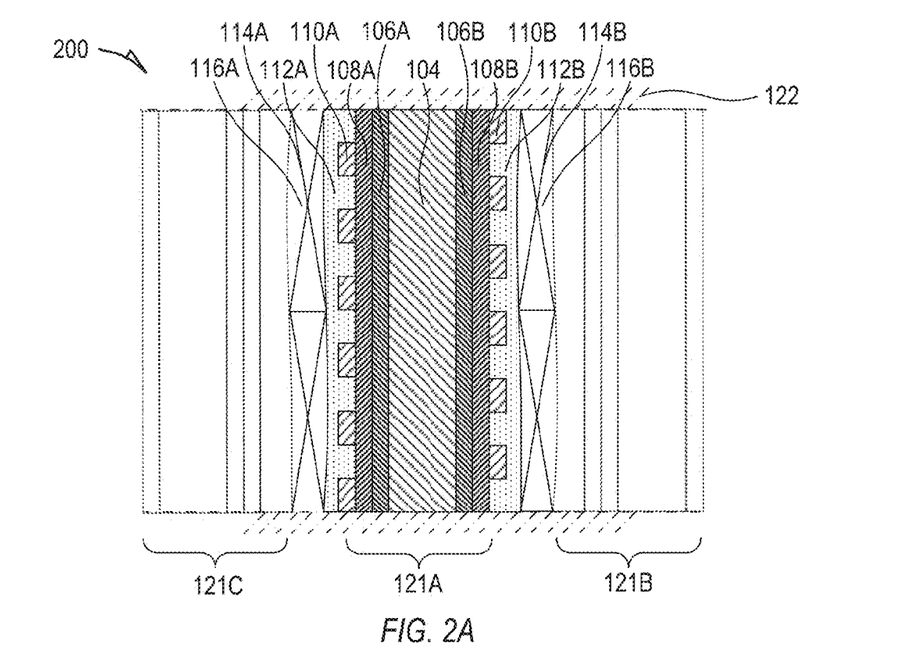
FIGS. 2A and 2B illustrate generally a section view of an example including a bipolar battery plate and a corresponding bipolar battery architecture.
Figure 2B:
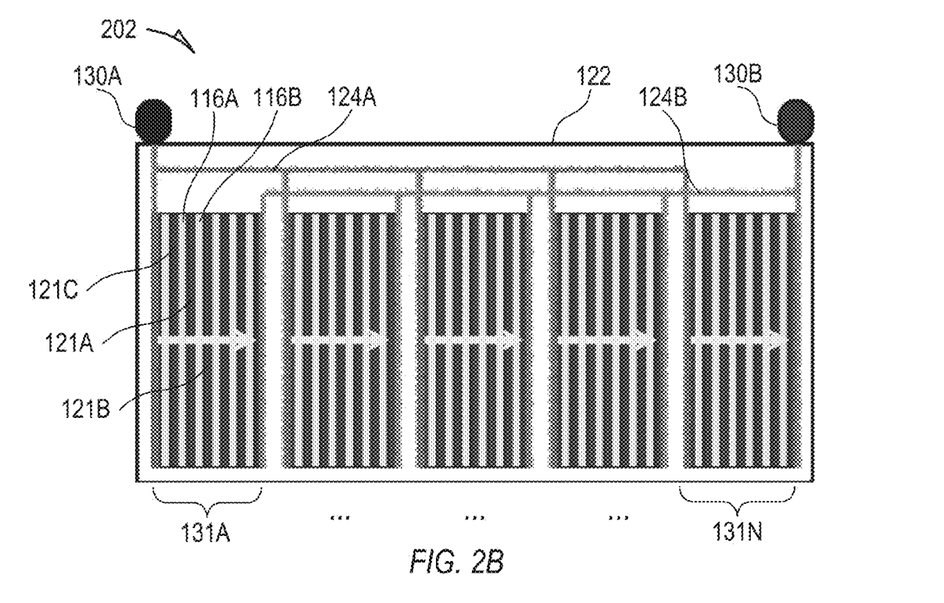

FIGS. 2A and 2B illustrate generally a section view of an example including a bipolar battery plate 121A and a corresponding bipolar battery architecture. Similar to the example of FIG. 1A, a first bipolar battery plate 121A can include a conductive silicon wafer 104 as a current collector. The bipolar battery plate 121A can include one or more of an ohmic contact layer 106A and an adhesion layer 108A located at or near a first surface of the conductive silicon wafer 104. An active material 112A can include a first polarity, such as supported during or after fabrication by a mechanical support 110A. A second ohmic contact layer 106B can be included on a second surface of the conductive silicon wafer 104 opposite the first surface. The second ohmic contact layer 106B can include the same material as the first ohmic contact layer 106A or a different material, such as to provide an electrode for connection to other portions of a battery assembly, to provide a corrosion-resistant layer, or to provide a mirror image configuration having a stack-up similar to the first surface of the conductive silicon wafer 104. A second adhesion layer 108B can also be included. A second active material 112B can be included, such as having a polarity opposite the first active material 112A. As in the example of FIG. 1A, a first electrolyte region 116A can separate the battery plate 121A from an adjacent battery plate 121C, and a second electrolyte region 116B can separate the battery plate 121A from another adjacent battery plate 121B. The electrolyte regions 116A and 116B can include a separator, such as assist in maintaining a specified separation between the battery plates. The electrolyte regions 116A and 116B are generally fluidically isolated from each other so that conduction occurs serially through a bulk of the conductive silicon wafer 104.

FIG. 2B illustrates generally an example that can include a battery pack 202 having one or more bipolar battery plates, such as bipolar plates 121A, 121B, and 121C. Such bipolar plates can be sandwiched with electrolyte in regions 116A and 116B, for example, to form sealed cells. In an example, an electrolyte in region 116A can be one or more of fluidically isolated or hermetically sealed so that electrolyte cannot bypass the bipolar plate 121A to an adjacent region such as the electrolyte region 116B. As shown illustratively in FIG. 2B, cells can be disposed in a series configuration. The cells can be aligned to form a stack 131A.

In a bipolar architecture, a current collector (e.g., a silicon wafer 104 such as included as a portion of the bipolar plate 121A) can be shared between the negative electrode of one cell and a positive electrode of the next. A first bus 124A can connect to a first electrode in each stack 131A through 131N, and a second bus 124B can connect to an opposite electrode in each stack 131A through 131N. By contrast with FIG. 1B, the stacks 131A through 131N can each provide serial connections through the bulk of the conductive silicon wafers as shown by the arrows. In this manner, a total number of interconnect buses external to the stack 131A through 131N can be reduced as compared to an architecture using monopolar plates.

Other configurations of interconnecting one or more stacks 131A through 131N can be used. For example, bipolar stacks 131A through 131N can be connected in parallel for lower voltage applications, such as to assemble a lower voltage battery pack. Alternatively, a single bipolar stack with many cells can form a higher-voltage pack. In either case, the voltage of the battery pack can be (Np−1) *Vcell, where Np can represent the number of current collector plates in each stack, and Vcell can represent the cell voltage.

Figure 3A:
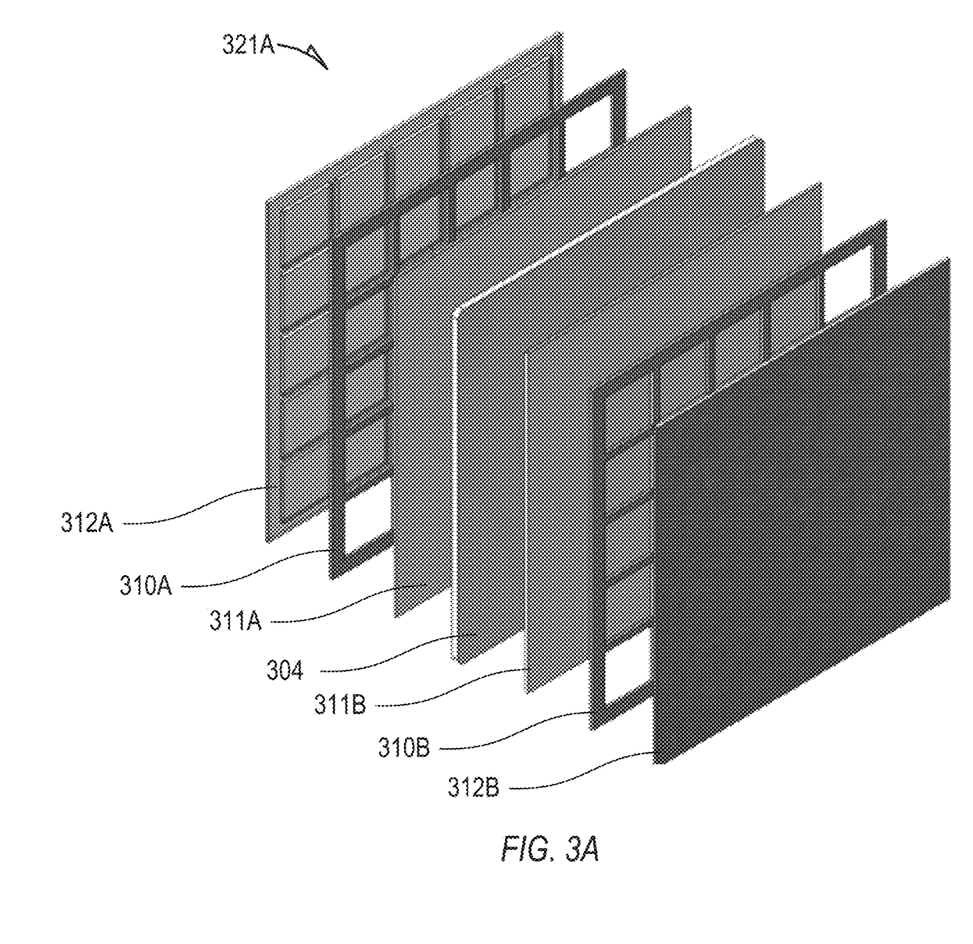
FIG. 3A illustrates generally an example of a bipolar plate that can include a silicon wafer current collector and a mechanical support grid.
Figure 3B:
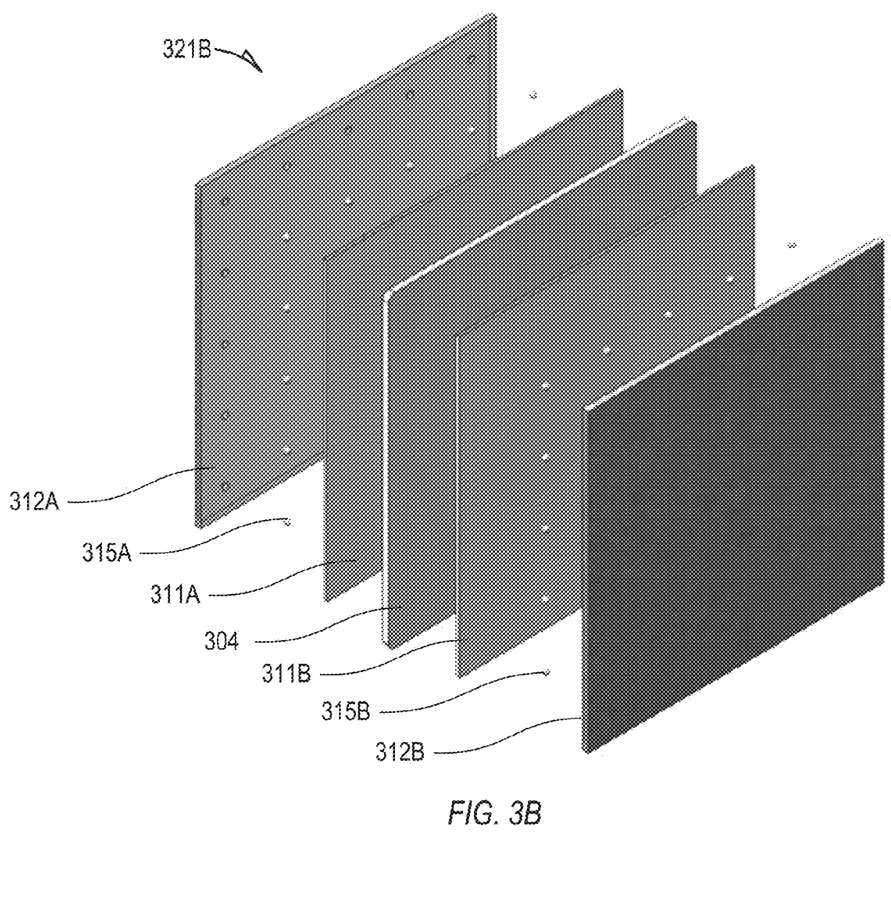
FIG. 3B illustrates generally an example of a bipolar plate that can include a silicon wafer current collector and a solder bump array.

FIGS. 3A and 3B illustrates generally examples of a bipolar plate that can include a silicon wafer 304 current collector and one or more mechanical support grids 310A or 310B (as in FIG. 3A) or solder bump patterns 315A or 315B (as in FIG. 3B), and such as shown in section view in the example of FIG. 2A. As mentioned in relation to the examples above, a lead acid battery can use a silicon wafer 304 as a current collector, as shown illustratively in FIGS. 1A through 1B, and 2A through 2B.

Silicon wafers are generally fabricated for use in semiconductor, solar, and other microelectronic or microelectromechanical (MEMS) applications. Silicon wafers, such as those with a density of about 2.65 grams per cubic centimeter, can be much lighter when used as a current collector than generally-available lead grid structures. Such silicon wafers can be resistant (or can be made even more resistant) to $H_2SO_4$ corrosion. Because of a high volume of use in other applications, silicon wafers are readily available at low cost. Although mono-crystalline silicon is generally a semiconductor, it can be made conductive by appropriate doping. In an example, a silicon wafer can be made conductive by such doping, such as to provide resistivity less than 0.001 $\Omega$-cm. For applications as current collectors in batteries, a resistivity need not be so low. For example, a wafer resistivity of 5 $\Omega$-cm or less can be used. In an example, a silicon wafer for current collector use can be, for example, heavily n-doped with phosphorous or arsenic to provide excess carriers and a resistivity of less than 5 $\Omega$-cm.

Silicon wafers are available in different sizes (e.g., up to 300 millimeters diameter or beyond), shapes (e.g., round or square), crystal orientation and structure (e.g., single- or multi-crystalline), and surface textures (e.g., textured such as provided after sawing from an ingot, or smooth after treatment such as lapping or etching). Silicon wafers generally used by the solar industry can be used for battery applications, as they are available in high quantities at low cost. Standard solar wafers can be around 125 millimeter or around 156 millimeters square, with thickness less than 750 micrometers, such as 200 micrometers. Such dimensions are compatible with the cross-sectional dimensions of generally-available lead acid batteries. Circular or other irregularly-shaped wafers can also be cut into other geometries, such as into rectangles with side lengths ranging from around 120 millimeters to around 200 millimeters to suit certain applications. Although thinner silicon wafers can enhance an energy density of the battery pack, a wafer thickness can be biased toward or otherwise selected for mechanical robustness, such as trading off such robustness with energy density. As-cut single-crystalline or multi-crystalline wafers can have rough surfaces. Roughness, such as along saw-roughened surfaces, can be cleaned and textured by various processes, such as can include chemical wet etch procedures. In an example, a metallurgical grade silicon wafer can be specified for use in a battery plate.

The bipolar battery plate 321A or 321B can include a first active material 312A, such as a paste, corresponding to a first polarity. The paste 312A can be applied to a first mechanical support 310A, such as a mechanical support 310A fabricated or patterned using a variety of materials. One or more layers such as a first adhesion layer or first ohmic contact layer 311A can be formed on or as a portion of the conductive silicon wafer 304. On an opposite side of the conductive silicon wafer 304, one or more layers such as a second adhesion layer or a second ohmic contact layer 311B can be formed. A second mechanical support 310B can be used, such as to provide support for a second active material 312B, corresponding to a second polarity opposite the polarity of the first active material 312A.

The mechanical supports 310A, 310B, 315A, and 315B shown in the examples of FIGS. 3A and 3B are illustrative. Other configurations can be used, such as a pattern or array of linear segments, or an array of mesa structures (e.g., such as corresponding to an "inverse" of the grid pattern of FIG. 3A). The mechanical support can be fabricated using one or more of printing, deposition (e.g., electrodeposition), molding, stamping, or using one or more other techniques.

Figure 4:
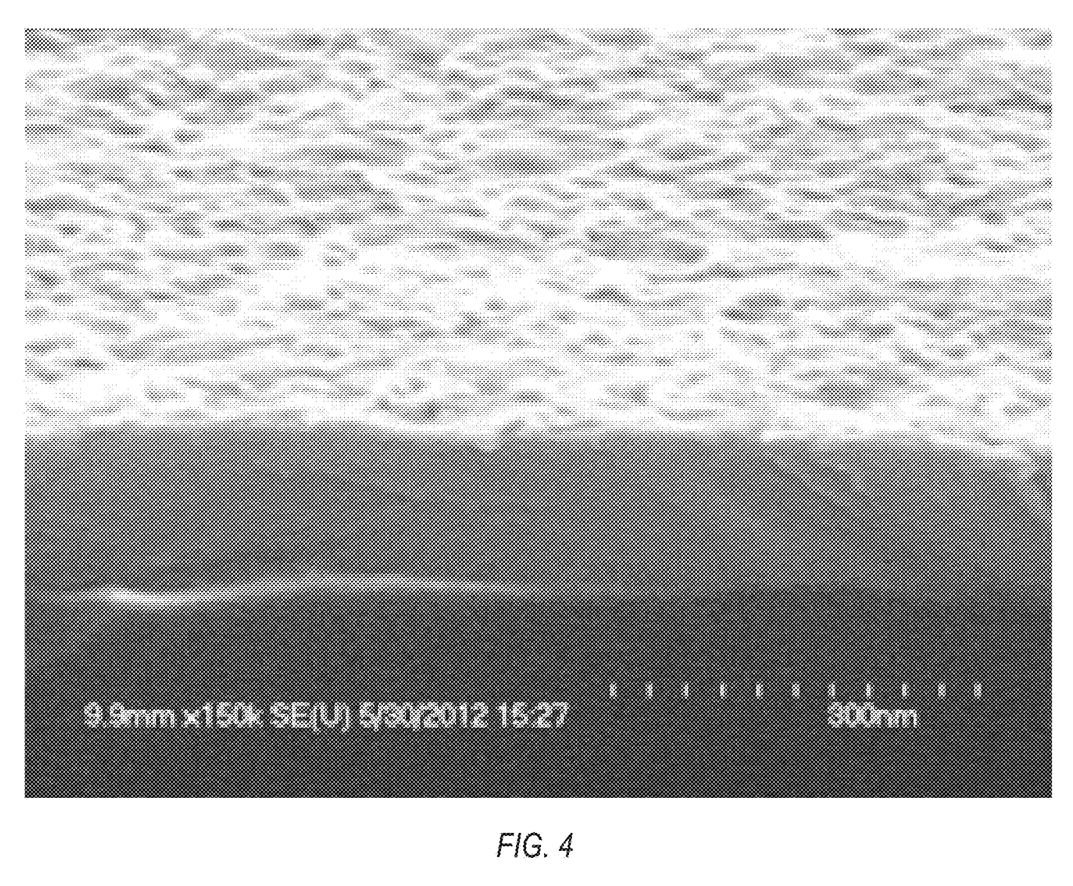
FIG. 4 illustrates generally an illustrative example of a scanning electron micrograph (SEM) of nickel silicide (NiSi) on a silicon wafer, such as can be used as a current collector.

FIG. 4 illustrates generally an illustrative example of a scanning electron micrograph (SEM) of nickel silicide (NiSi) on a silicon wafer, such as can be used as a current collector. In order to create an interface with low contact resistance between the active material and the silicon wafer current collector, it can be desirable to form an ohmic contact layer (such as at layer 311A or 311B as shown in FIG. 3A or 3B) on the silicon wafer 304 surface. The ohmic contact layer can also protect the silicon surface from the formation of a native oxide, such as in an ambient atmosphere. Formation of such an ohmic contact layer can include depositing a thin metal layer on the silicon surface, followed by annealing at high temperature. The thickness of the metal layer can be, for example, as thin as about 20 nanometers, although thicker layers, up to about 200 nanometers, or more, can be used to provide more conformal or continuous coating on textured surfaces. For example, nickel (Ni) can be deposited onto silicon by physical vapor deposition ("PVD") using equipment generally used for solar cell fabrication.

In an illustrative example, a silicide layer can be formed using PVD and annealing of the deposited material in nitrogen or argon ambient at a temperature of at least 450° C.

Annealing the wafer to around 500 to around 660° C. can form a nickel silicide (NiSi) on the surface. In the illustration of the micrograph shown in FIG. 4, a thickness of the NiSi layer is around 150 nm. A blurred interface between nickel silicide and silicon can be observed in FIG. 4, indicating the formation of an ohmic contact at the interface. In some embodiments, metals such as titanium, tantalum, tungsten, molybdenum, and combinations thereof, can also be used to form low-resistivity silicides with the silicon surface upon high temperature annealing.

Additional layers can be deposited onto the metal silicide surface to protect it from oxidation and to improve its adhesion to the active material layers. These layers can be referred to as barrier layers, and can include Ti, Ta, W, Mo, Sn, In, TiN, TaN, WN, MoN, TiW, combinations thereof, or one or more other materials, and they can be relatively thin, such as having a thickness of around 20 to 200 nanometers. Such metals can be selected based on their refractory characteristics (e.g., Ti, Ta, W, Mo), or their solderability (e.g., In, Sn.)

These metals, alloys thereof, silicides, or nitrides can be deposited onto either one side or both sides of the silicon wafer current collector by using manufacturing equipment such as, for example, equipment supplied by INTEVAC of Santa Clara, Calif., as can be used for solar cell fabrication. In an illustrative example, a high-throughput "cluster tool" can be used to implement one or more of silicon wafer pre-clean, metal deposition, silicide formation, metal deposition or metal nitride deposition within an integrated process.

Figure 5A:
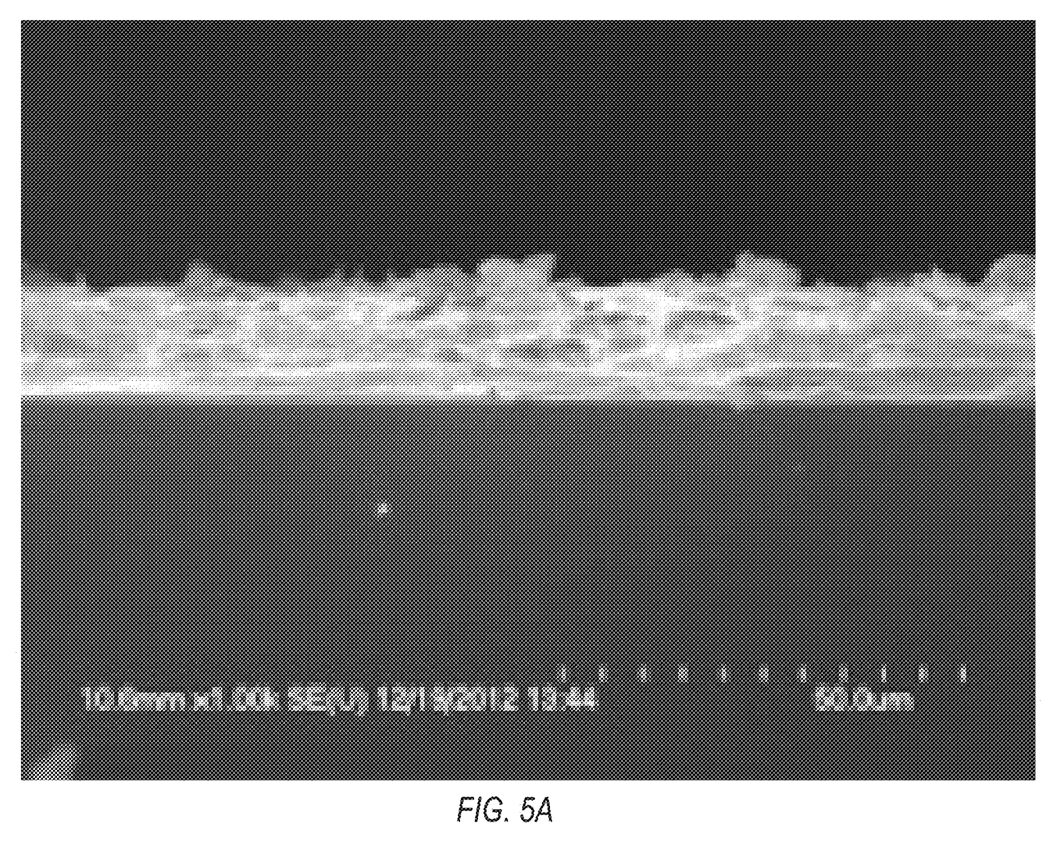
FIG. 5A illustrates generally an illustrative example of a micrograph showing a current collector including a 20 μm thick lead layer.
Figure 5B:
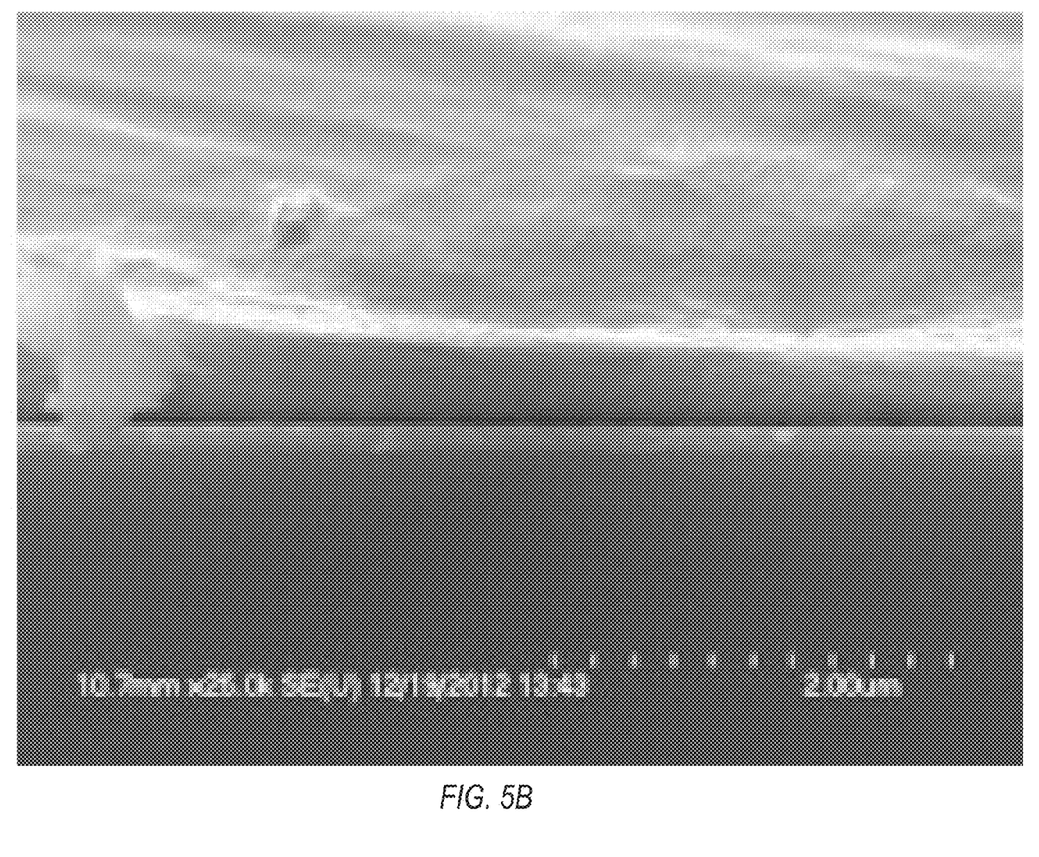
FIG. 5B illustrates generally an illustrative example similar to the example of FIG. 5A, but at a higher degree of magnification, illustrating good adhesion between a lead layer and a NiSi surface.

FIG. 5A illustrates generally an illustrative example of a micrograph showing a current collector including a 20 μm thick lead layer. FIG. 5B illustrates generally an illustrative example similar to the example of FIG. 5A, but at a higher degree of magnification, illustrating good adhesion between a lead layer and a NiSi surface.

As mentioned above, one or more other layers (e.g., adhesion or barrier layers) can be deposited onto an ohmic contact layer surface of a silicon wafer for applications where the wafer is to be used as a current collector. Such layers can serve to improve adhesion and provide mechanical support of the active material pastes. In a lead acid battery, such layers are specified to include materials compatible with lead acid chemistry. Electrodeposition can be a convenient method fabrication of such layers, and in some examples a film can be formed such as less than about 20 micrometers in thickness. In some examples, a thin adhesion layer of Pb can be electrodeposited onto the NiSi surface with a hydrofluoric-acid-containing plating bath, such as to provide the layer configuration shown in FIG. 5A.

A plating bath containing lead (II) tetrafluoroborate can be used for an electrodeposition process. One advantage of the hydrofluoric-acid-containing plating bath can be that the ohmic contact layer (e.g., a NiSi surface) can be cleaned in-situ during the electrodeposition process. This can improve adhesion at the interface between the NiSi and another layer (e.g., an adhesion layer or barrier layer). Other plating chemistries can be used. In an example, a Pb thin film can be doped with Sb, Bi, or Sn to improve its corrosion-resistant properties. In other examples, the adhesion layer can include one or more other materials such as Sn, TiN, In, or combinations thereof. In an example, a thin layer of $SnO_2$ can be electrodeposited onto a Ti surface to improve adhesion of positive $PbO_2$-based pastes. Adhesion layers can be deposited onto one side or both sides of the current collector, and such layers need not include the same material on both sides of the current collector.

Figure 6:
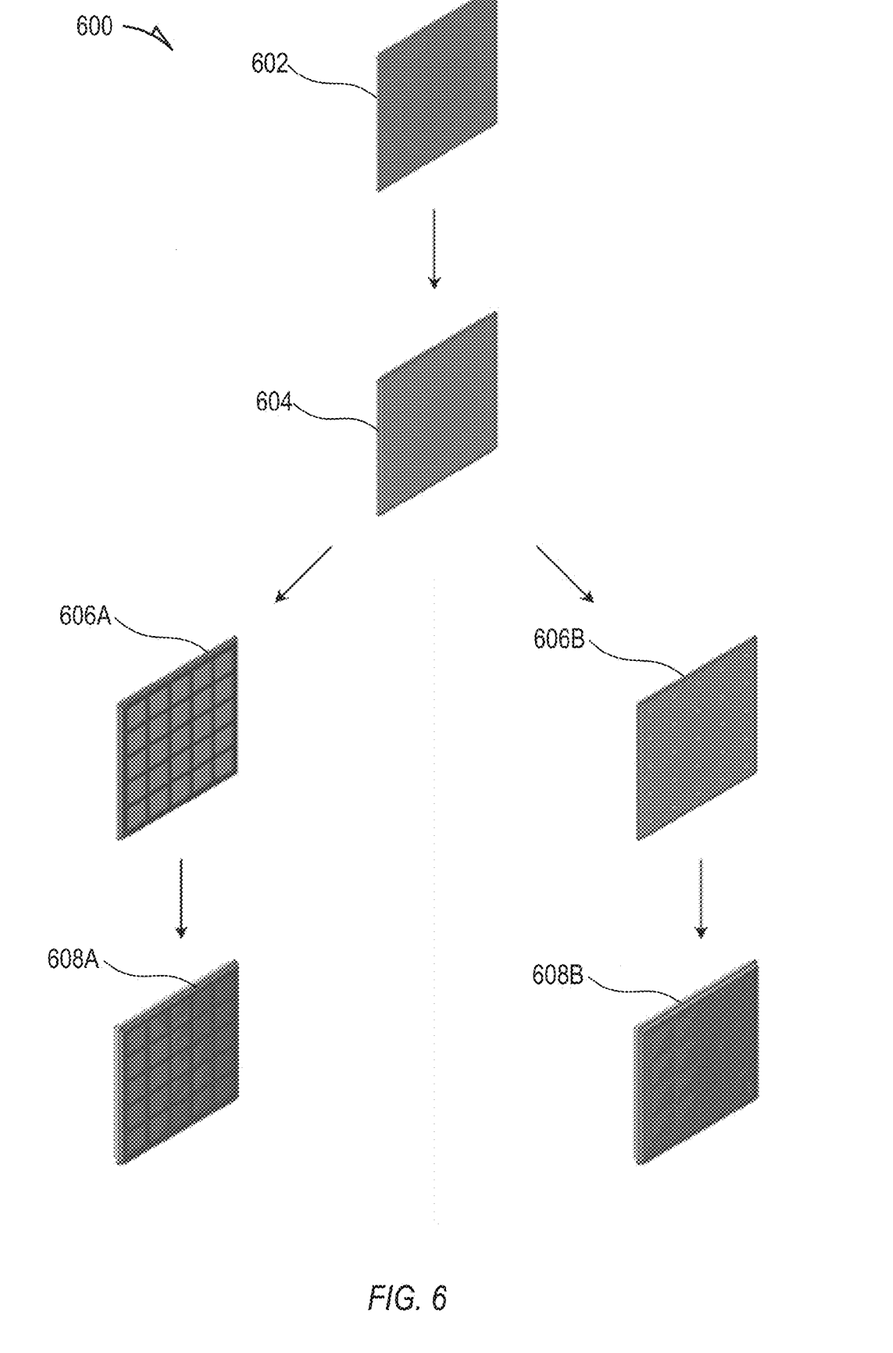
FIG. 6 illustrates generally a technique, such as method, that can include fabricating a bipolar battery plate including a silicon wafer current collector, according to an example.

FIG. 6 illustrates generally a technique 600, such as method, that can include fabricating a bipolar battery plate including a silicon wafer current collector, according to an example. At 602, a silicon wafer current collector can be formed. For example, such a wafer can be sawed out of a single crystal boule, or otherwise formed such as from a slab of multi-crystalline silicon. The silicon wafer can be purchased in a first geometry (e.g., a circular wafer) then further cut to a desired geometry. The silicon wafer can be polished, etched, lapped, or otherwise processed to provide a desired surface finish. The silicon wafer can be doped to achieve a desired conductivity level, such as having a desired conductivity type (e.g., n-type doping).

At 604, an ohmic contact layer can be formed on at least one surface of the conductive silicon wafer. Such an ohmic contact layer can include a silicide. In an example, each face of the wafer can include an ohmic contact layer, and the ohmic contact layers on each face need not be the same material or thickness as each other. One or more other layers (e.g., adhesion or barrier layers) can be included on one or more faces of the silicon wafer, such as deposited or otherwise formed upon one or more ohmic contact layers.

At 606A or 606B an arrayed pattern can be formed on the conductive silicon wafer, such as upon the ohmic contact layer, to provide or enhance mechanical support of the active material pastes. In one approach, at 606A, a square or rectangular grid pattern can be formed, such having a thickness of around 100 micrometers to around 500 micrometers. For example, such a grid can include Pb deposited on the surface of the conductive silicon wafer, such as by electrodeposition. Such electrodeposition can include use of a mechanical (e.g., contact) mask. In another approach, such as at 606B, an array bumps or mesas can be deposited on the current collector, such as by electrodeposition. In some examples, an array of Sn, Pb—Sn, or In—Sn solder pastes can be applied onto the current collector, such as by pasting, heat pressing, extrusion dispense, or screen printing. The array pattern can adhere naturally onto a Pb adhesion surface (e.g., adhesion layer) of the assembly. While the wafer, grid, and bump pattern configurations shown in FIG. 6 are rectangular, other shapes and symmetries can be used. In an example, an unmasked deposition can be used, such as followed by an etching process, to provide a specified pattern at 606A or 606B. In an example, one or more mesas or bumps can be from about 100 micrometers to about 500 micrometers in thickness. In an example, one or more lines or bumps can include Sb, Bi, In, Pb, Sn, Ag, or combinations thereof (e.g., an alloy).

At 608A or 608B, paste formulations and processing procedures compatible with generally-available lead acid batteries can be used to apply active material paste directly onto the silicon wafer assembly. For example, conductive silicon wafers can be made compatible with such pasting equipment, such as with minor modifications to adapt the size of such wafers. Because silicon has a high melting point and good thermal conductivity, curing temperatures used for generally-available pasting processes can be used to cure active material pastes as a portion of the current collector assembly including the conductive silicon wafer. With higher curing temperatures, a mechanical support including a Pb grid array pattern or a Sn solder bump array can be fused with the active material pastes on the current collector, which can result in strong adhesion and desirable mechanical support.

Figure 7:
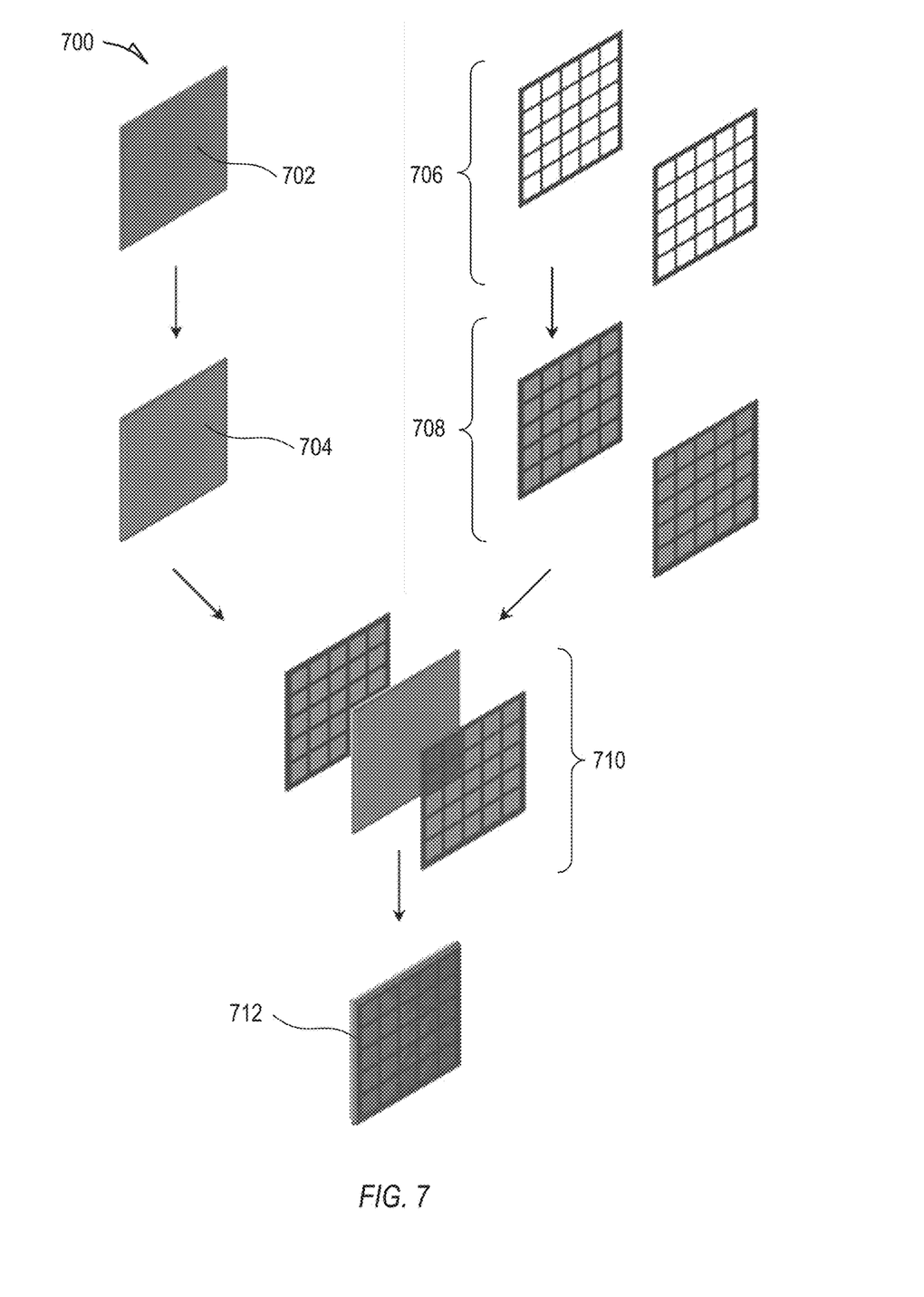
FIG. 7 illustrates generally a technique, such as method, that can include fabricating a bipolar battery plate including a silicon wafer current collector, according to an example.

FIG. 7 illustrates generally a technique 700, such as method, that can include fabricating a bipolar battery plate including a silicon wafer current collector, according to an example. In some cases, generally-available pasting equipment may not be suitable to directly apply an active material paste to a conductive silicon wafer current collector assembly. In cases where the silicon wafer current collector may be incompatible with the existing pasting equipment, active material pastes can be applied to "external" grids before such grids are assembled with the conductive silicon wafer. For example, the external grid can be made of $H_2SO_4$ resistant plastic such as one or more of acrylonitrile butadiene styrene ("ABS"), low density polyethylene ("LDPE"), polypropylene ("PP"), polyvinylidene fluoride ("PVDF"), or polytetrafluoroethylene ("PTFE"). In an example, an external grid can be formed of carbon graphite, which can have an advantage of being electrically conductive. The pasted grids can be then sandwiched with the wafer collector, and cured to form a bipolar plate assembly (see, e.g., FIG. 7).

At 702, a conductive silicon wafer can be formed, such as using one or more techniques discussed above in relation to FIG. 6 or elsewhere herein. At 704, one or more layers such as an ohmic contact or adhesion layer can be deposited, such as described in other examples elsewhere herein. At 706, an "external" mechanical support can be formed, such as can include a grid structure or other shape. As mentioned in examples elsewhere herein, such a mechanical support can be conductive or non-conductive. At 708, an active material paste can be applied, such as a first polarity active material paste to a first mechanical support, and a second polarity active material paste to a second mechanical support. At 710, the first and second pasted mechanical supports can be applied to the conductive silicon wafer. At 712, the pastes can be cured, such as thermally.

To assemble the bipolar lead acid battery using a bipolar plate assembly as described in the examples herein, the bipolar plates (including conductive silicon wafers) can be sandwiched with separators. As shown in FIGS. 1A, 1B, 2A, and 2B, gaps between the plates can be filed with an electrolyte (e.g., $H_2SO_4$). Edges of the bipolar plates can be sealed, so that each electrolyte compartment is electrically isolated. In an example, electrolyte can be integrated with a mechanical separator. For example, electrolyte can be mixed with silica dust to form an immobilized gel commonly known as gelled electrolyte. In an example, absorbed glass mats (AGM) can be used, such as including electrolyte-saturated boron silicate mats as separators.

VARIOUS NOTES & EXAMPLES

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for providing a bipolar battery plate, the method comprising:
    applying an active material to a first mechanical support, the first active material having a first polarity;
    adhering the first mechanical support including the first active material to a conductive silicon wafer;
    applying a second active material to a second mechanical support; and
    adhering the first and second mechanical supports including the first and second active materials to the conductive silicon wafer to provide the bipolar battery plate;
    wherein the conductive silicon wafer comprises a first silicide between the first active material and the bulk of the silicon wafer.

2. The method of claim 1, comprising forming a first adhesion layer located between the first active material and the first silicide layer.

3. The method of claim 2, wherein the first adhesion layer includes lead.

4. The method of claim 1, wherein the conductive silicon wafer is n-doped.

5. The method of claim 1, wherein the conductive silicon wafer is one of mono-crystalline or multi-crystalline.

6. The method of claim 1, wherein the first and second mechanical supports include a plastic.

7. The method of claim 1, wherein the first and second mechanical supports include lead.

8. A method for providing a bipolar battery plate, the method comprising:
    forming a conductive silicon wafer;
    forming a first silicide on the conductive silicon wafer;
    forming a first mechanical support;
    applying an active material to the first mechanical support, the first active material having a first polarity;
    adhering the first mechanical support including the first active material to a conductive silicon wafer to provide a battery plate;
    forming a second mechanical support;
    applying a second active material to the second mechanical support; and
    adhering the first and second mechanical supports including the first and second active materials to the conductive silicon wafer to provide a bipolar battery plate.

9. The method of claim 8, comprising forming a second silicide layer on a second surface of the conductive silicon wafer.

10. The method of claim 9, wherein the first and second silicide layers include materials that differ from each other.

11. The method of claim 8, wherein the conductive silicon wafer is n-doped.

12. The method of claim 8, wherein the conductive silicon wafer is one of mono-crystalline or multi-crystalline.

13. The method of claim 8, wherein the first and second mechanical supports include a plastic.

14. The method of claim 8, wherein the first and second mechanical supports include lead.

15. A method for providing a bipolar battery assembly, including:
    forming a first bipolar battery plate including:
        applying an active material to a first mechanical support, the first active material having a first polarity;
        adhering the first mechanical support including the first active material to a conductive silicon wafer to provide a battery plate;
        applying a second active material to a second mechanical support; and
        adhering the first and second mechanical supports including the first and second active materials to the conductive silicon wafer to provide a bipolar battery plate; and
    housing the first bipolar battery plate and a second bipolar battery plate to define an electrolyte region between the first and second bipolar battery plates, the eletrolyte region located between a surface of the first bipolar battery plate having a first polarity, and a surface of the second bipolar battery plate having a second polarity;
    wherein the conductive silicon wafer of the first biopolar battery plate comprises a first silicide between the first active material and the bulk of the silicon wafer.

16. The method of claim 15, wherein the electrolyte region is hermetically isolated from other electrolyte-containing regions within the housing.

17. The method of claim 15, comprising placing a separator between the first and second bipolar battery plates in the electrolyte region.

18. The method of claim 17, wherein the separator includes an absorbed glass mat.

19. The method of claim 15, wherein the first and second mechanical supports include a plastic.

20. The method of claim 15, wherein the first and second mechanical supports include lead.

* * * * *

UNITED STATES PATENT AND TRADEMARK OFFICE
CERTIFICATE OF CORRECTION

PATENT NO. : 10,044,042 B2
APPLICATION NO. : 15/793277
DATED : August 7, 2018
INVENTOR(S) : Mui et al.

Page 1 of 1

It is certified that error appears in the above-identified patent and that said Letters Patent is hereby corrected as shown below:

On the Title Page

On page 2, in Column 1, under "Foreign Patent Documents", Line 9, delete "102009001247" and insert --1020090012472-- therefor On page 2, in Column 1, under "Foreign Patent Documents", Line 10, delete "102016002487" and insert --1020160024876-- therefor In the Claims In Column 12, Line 41, in Claim 15, delete "eletrolyte" and insert --electrolyte-- therefor In Column 12, Line 45, in Claim 15, delete "biopolar" and insert --bipolar-- therefor Signed and Sealed this
Twenty-eighth Day of May, 2019

Andrei Iancu
*Director of the United States Patent and Trademark Office*